(12) United States Patent
Kim

(10) Patent No.: US 7,776,671 B2
(45) Date of Patent: Aug. 17, 2010

(54) INDUCTOR FOR SEMICONDUCTOR DEVICE AND METHOD OF FABRICATING THE SAME

(75) Inventor: Nam Joo Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 413 days.

(21) Appl. No.: 11/645,655

(22) Filed: Dec. 27, 2006

(65) Prior Publication Data

US 2007/0152300 A1    Jul. 5, 2007

(30) Foreign Application Priority Data

Dec. 29, 2005    (KR) ............... 10-2005-0134224

(51) Int. Cl.
*H01L 21/338* (2006.01)
*H01L 21/8234* (2006.01)
*H01L 21/8222* (2006.01)

(52) U.S. Cl. ............... 438/171; 438/329; 438/238

(58) Field of Classification Search ............... 438/171, 438/329, 238; 257/531, E21.022
See application file for complete search history.

(56) References Cited

U.S. PATENT DOCUMENTS

| 6,037,649 A * | 3/2000 | Liou ............... 257/531 |
| 6,426,267 B2 * | 7/2002 | Liou ............... 438/319 |
| 6,559,751 B2 | 5/2003 | Liu et al. |

FOREIGN PATENT DOCUMENTS

EP    551735 A1 *    7/1993

* cited by examiner

*Primary Examiner*—Cuong Q Nguyen
(74) *Attorney, Agent, or Firm*—Lowe Hauptman Ham & Berner LLP

(57) ABSTRACT

The inductor for a semiconductor device comprises a first interlayer dielectric formed on a top of a silicon substrate, at least one first metal wire formed on a top of the first interlayer dielectric, a second interlayer dielectric formed on a top of the first interlayer dielectric to cover the first metal wire, at least one second metal wire formed on a top of the second interlayer dielectric and connected to the first metal wire, and an upper protective film formed on the top of the second interlayer dielectric to cover the second metal wire, wherein the first and second metal wires are alternately arranged and are formed in a spiral structure.

2 Claims, 3 Drawing Sheets

US 7,776,671 B2

INDUCTOR FOR SEMICONDUCTOR DEVICE AND METHOD OF FABRICATING THE SAME

CLAIM OF PRIORITY UNDER 35 U.S.C. §119

The present application claims priority to Korean patent application No. KR 2005-0134224, filed in the Korean Patent Office on Dec. 29, 2005, the entire contents of which is hereby incorporated by reference herein.

FIELD OF THE INVENTION

The present invention relates to a semiconductor device and, more particularly, to an inductor for a semiconductor device, and a method for fabricating the inductor, which can expand the usable frequency band of an inductor by decreasing the parasitic capacitance between adjacent metal wires of the inductor.

BACKGROUND OF THE INVENTION

Generally, an inductor is one component constituting a circuit for Radio Frequency (RF) transmission/reception, and is essentially used in RF devices and analog devices, which have been widely used with the expansion of the wireless communication market. An inductor is generally formed in a spiral structure. Such an inductor having a spiral structure is disadvantageous in that the self-resonant frequency thereof decreases due to parasitic capacitance between the metal wires of the inductor.

Generally, the transition frequency point of an inductor, at which the input impedance of the inductor changes from inductance to capacitance as the frequency increases, is called a self-resonant frequency. An inductor is mainly used at a frequency lower than the self-resonant frequency. In the case of an inductor having a spiral structure, as the inductance value of a device increases, the size of the device increases and a parasitic component also increases so that the self-resonant frequency of the inductor decreases. This results in an actual reduction of a usable frequency band.

Hereinafter, a conventional inductor is described with reference to the drawings. FIG. 1A is a plan view showing a conventional inductor, and FIG. 1B is a cross-sectional view taken along line A-A of FIG. 1A, in accordance with the prior art.

Referring to FIGS. 1A and 1B, an interlayer dielectric 11 is formed on the top of a silicon substrate 10, and is then planarized. Thereafter, an inductor metal wire 12 having a spiral structure is formed on the interlayer dielectric 11. The inductor metal wire 12 is connected to a lower metal wire 12' through a via (not shown). An upper protective film 13 is formed on the inductor metal wire 12.

The parasitic capacitance of an inductor having a spiral structure increases as the interval (a) between the inductor metal wires 12 is narrowed, which results in the decrease in the self-resonant frequency and, also the reduction in the usable frequency band of the inductor accordingly.

SUMMARY OF THE INVENTION

It is, therefore, an object of the present invention to provide an inductor for a semiconductor device, which can expand the usable frequency band of an inductor by decreasing the parasitic capacitance between inductor metal wires, and a method of fabricating the inductor.

In accordance with an embodiment of the present invention, there is provided an inductor for a semiconductor device, comprising a first interlayer dielectric formed on a top of a silicon substrate, at least one first metal wire formed on a top of the first interlayer dielectric, a second interlayer dielectric formed on a top of the first interlayer dielectric to cover the first metal wire, at least one second metal wire formed on a top of the second interlayer dielectric and connected to the first metal wire, and an upper protective film formed on the top of the second interlayer dielectric to cover the second metal wire, wherein the first and second metal wires are alternately arranged and are formed in a spiral structure.

In one embodiment of the inductor, the second interlayer dielectric may have a thickness greater than that of the first metal wire. Additionally, the second interlayer dielectric may comprise at least one via for connecting the first metal wire to the second metal wire. In some embodiments, the first metal wire and the second metal wire may be disposed on separate geometric planes.

In accordance with another embodiment of the present invention, there is provided a method of fabricating an inductor for a semiconductor device, comprising forming a first interlayer dielectric on a top of a silicon substrate, forming at least one first metal wire on a top of the first interlayer dielectric, forming a second interlayer dielectric on a top of the first interlayer dielectric to cover the first metal wire, forming at least one second metal wire on a top of the second interlayer dielectric so that the second metal wire is connected to the first metal wire, and forming an upper protective film on the top of the second interlayer dielectric to cover the second metal wire, wherein the first and second metal wires are alternately arranged and are formed in a spiral structure.

In one embodiment of the method, the second interlayer dielectric may have a thickness greater than that of the first metal wire. In some embodiments, forming the second interlayer dielectric may additionally comprise forming at least one via in the second interlayer dielectric for connecting the first metal wire to the second metal wire.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
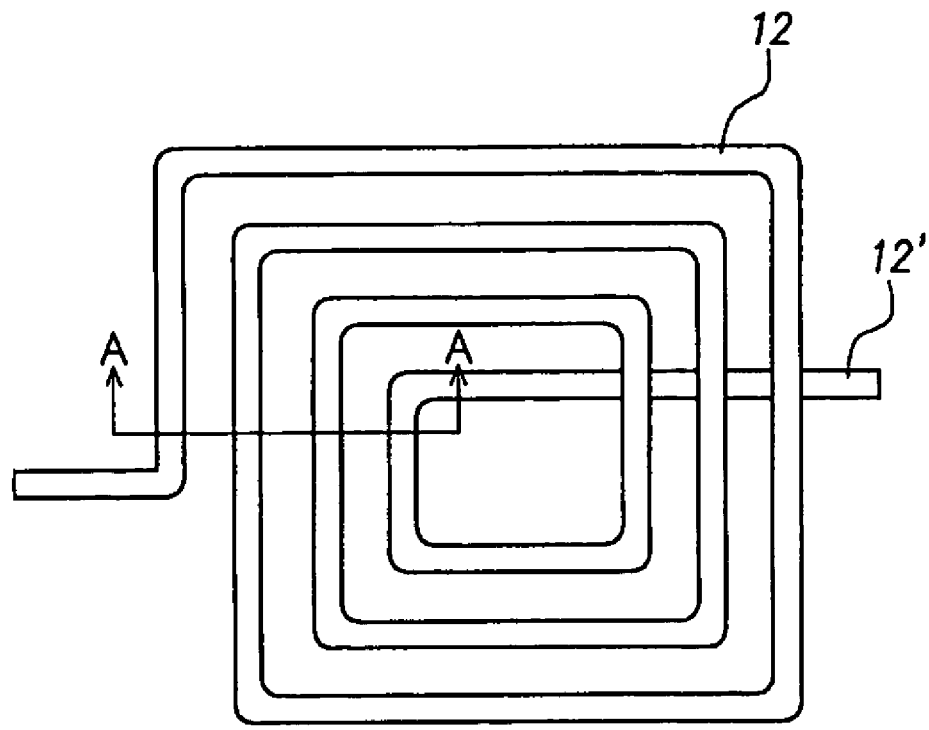
FIGS. 1A and 1B are a plan view and a cross-sectional view showing a conventional inductor, in accordance with the prior art.
Figure 1B:
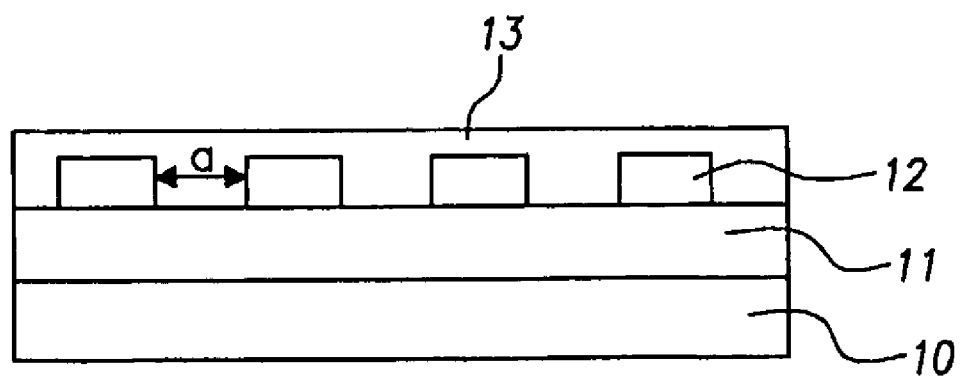

Hereinafter, preferred embodiments of the present invention will be described in detail with reference to the accompanying drawings so that they can be readily implemented by those skilled in the art.

A description of technical content that is well known to those skilled in the art and is not directly related to the present invention is omitted when embodiments of the present invention are described. The reason for this is to omit unnecessary description, and to more definitely transmit the gist of the present invention rather than making the gist of the present invention unclear. For the same reason, some components in the drawings are exaggeratedly shown, omitted, or schematically shown. The sizes of respective components in the drawings do not reflect actual sizes.

Figure 2A:
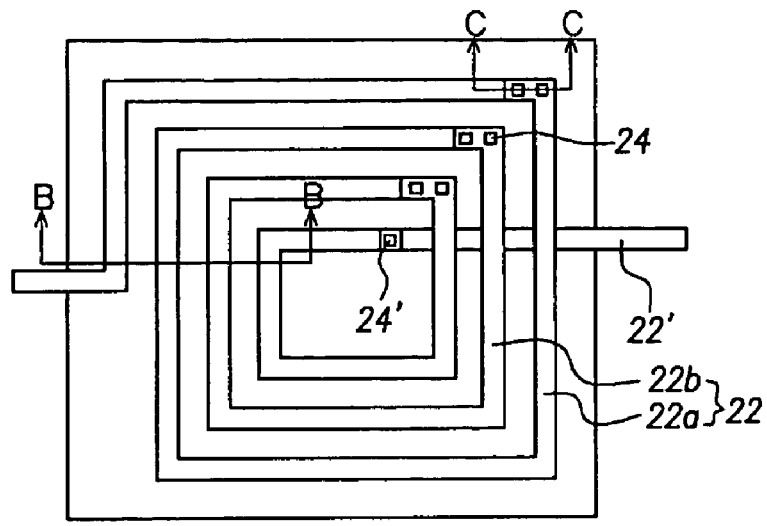
FIGS. 2A to 2C are a plan view and cross-sectional views showing an inductor according to an embodiment of the present invention.
Figure 2B:
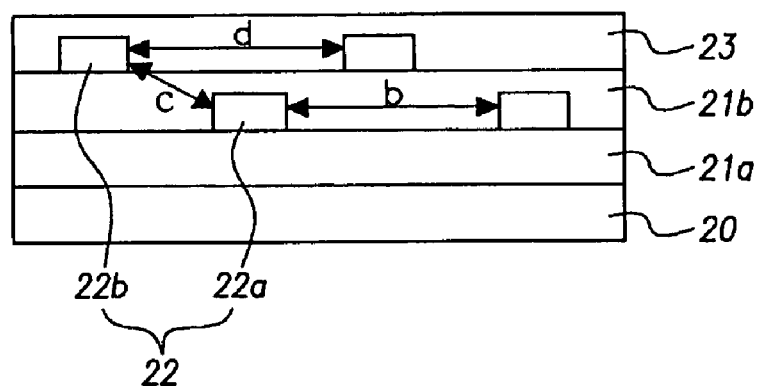
Figure 2C:
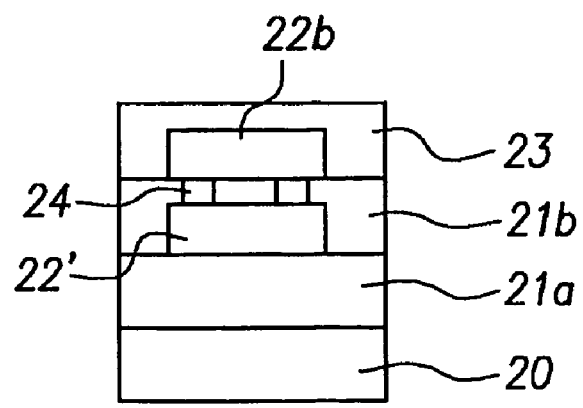

FIG. 2A is a plan view showing an inductor according to an embodiment of the present invention, and FIGS. 2B and 2C are cross-sectional views taken along line B-B and line C-C of FIG. 2A, respectively.

Referring to FIGS. 2A to 2C, an inductor metal wire 22 having a spiral structure is formed on the top of interlayer dielectrics 21a and 21b which are sequentially formed on a silicon substrate 20. The inductor metal wire 22 is connected to a lower metal wire 22' through vias 24, and an upper protective film 23 is formed on the inductor metal wire 22.

The inductor metal wire 22 is formed on two layers, that is, upper and lower layers. First metal wires 22a are formed on the top of the first interlayer dielectric 21a, which is a lower layer, and second metal wires 22b are formed on the top of the second interlayer dielectric 21b, which is an upper layer. The first interlayer dielectric 21a is formed on the top of the silicon substrate 20, and the second interlayer dielectric 21b is formed on the top of the first interlayer dielectric 21a to cover the first metal wires 22a. The first metal wires 22a and the second metal wires 22b are connected to each other through the vias 24. Further, the first and second metal wires 22a and 22b are alternately arranged, thus preventing metal wires formed on the same layer from being adjacent to each other.

As described above, since the first and second metal wires 22a and 22b are alternately arranged on different layers, the intervals b, c and d between inductor metal wires are widened, compared to the case where the first and second metal wires 22a and 22b are arranged on the same layer. Accordingly, the parasitic capacitance decreases and the self-resonant frequency increases, thereby expanding the usable frequency band.

Figure 3A:
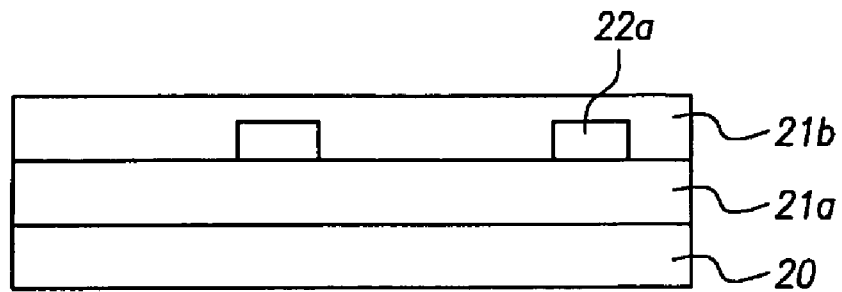
FIGS. 3A to 3C are cross-sectional views showing a method of fabricating an inductor according to an embodiment of the present invention.
Figure 3B:
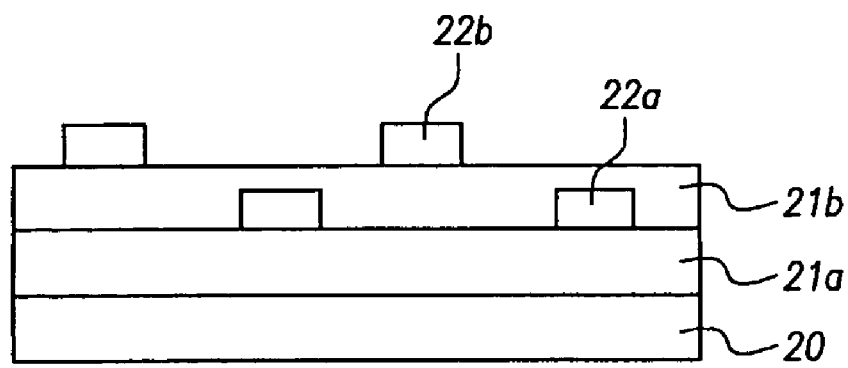
Figure 3C:
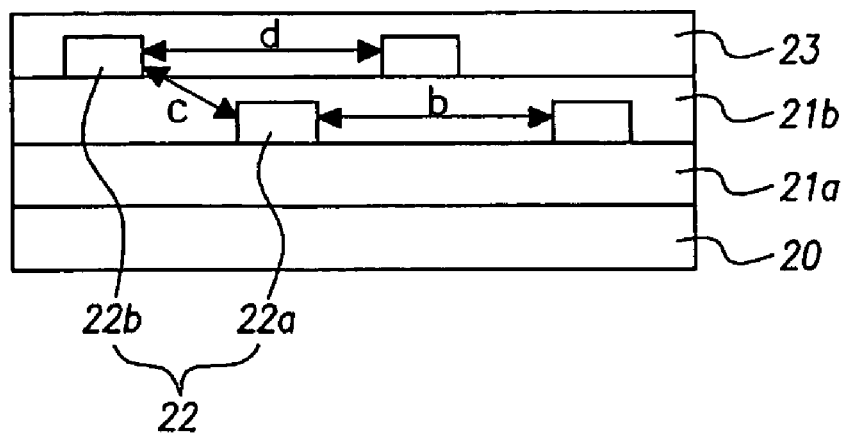

Hereinafter, a method of fabricating an inductor is described. The structure of an inductor is also further clarified from the later description of the fabricating method. FIGS. 3A to 3C are sectional views showing the method of fabricating an inductor according to an embodiment of the present invention.

First, as shown in FIG. 3A, the first interlayer dielectric 21a is formed on the top of the silicon substrate 20, and is then planarized. Next, the first metal wires 22a are formed on the top of the first interlayer dielectric 21a. The first metal wires 22a are formed using a method of depositing a metal layer on the entire surface of the first interlayer dielectric 21a and patterning the metal layer through a photo etching process. Next, the second interlayer dielectric 21b is formed on the first interlayer dielectric 21a to completely cover the first metal wires 22a, and is then planarized. Further, the second interlayer dielectric 21b is selectively etched to form via holes, and the via holes are filled with conductive materials, thus the vias (24 of FIGS. 2A and 2C) are formed.

Next, as shown in FIG. 3B, the second metal wires 22b are formed on the top of the second interlayer dielectric 21b. The method of forming the second metal wires 22b is the same as that of the first metal wires 22a. The second metal wires 22b and the first metal wires 22a are alternately formed so that they are arranged on different layers. In this case, the second metal wires 22b are connected to the first metal wires 22a through vias 24 formed in the second interlayer dielectric 21b.

Next, as shown in FIG. 3C, the upper protective film 23 is formed to completely cover the inductor metal wire 22b.

As described above, the present invention provides an inductor and a method of fabricating the inductor, in which first and second metal wires are alternately formed on different interlayer dielectrics, so that a dual-layer inductor metal wire, in which metal wires formed on the same layer are not adjacent to each other, is implemented. Therefore, the present invention is advantageous in that, since the interval between inductor metal wires is widened compared to the case where all inductor metal wires are arranged on the same layer, the parasitic capacitance decreases and the self-resonant frequency increases, thus the usable frequency band can be expanded.

Although the invention has been shown and described with respect to the preferred embodiments, and specific terms have been used, the preferred embodiments and specific terms are used in their general meaning only, in order to easily describe the technical content of the present invention and to facilitate the understanding of the present invention, and are not intended to limit the scope of the present invention. It will be understood by those skilled in the art that various changes and modifications may be made without departing from the spirit and scope of the invention as defined in the following claims.

What is claimed is:

1. A method of fabricating an inductor for a semiconductor device, comprising:
    forming a first interlayer dielectric on a top of a silicon substrate;
    forming two or more first metal wires on a top of the first interlayer dielectric;
    forming a second interlayer dielectric on a top of the first interlayer dielectric to cover the first metal wire;
    forming two or more second metal wires on a top of the second interlayer dielectric so that the second metal wire is connected to the first metal wire; and
    forming an upper protective film on the top of the second interlayer dielectric to cover the second metal wire,
    wherein the first and second metal wires are alternately arranged and are formed in a spiral structure,
    wherein the forming the second interlayer dielectric further comprises forming three or more vias in the second interlayer dielectric,
    wherein each of the vias connects one of the first metal wires to one of the second metal wires.

2. The method of claim 1, wherein the second interlayer dielectric has a thickness greater than that of the first metal wire.

* * * * *